(12) United States Patent
Ootsuka

(10) Patent No.: US 10,297,628 B2
(45) Date of Patent: *May 21, 2019

(54) SOLID-STATE IMAGE PICKUP DEVICE, ELECTRONIC APPARATUS, AND MANUFACTURING METHOD INCLUDING VARIOUS SHAPED MICROLENSES

(71) Applicant: Sony Semiconductor Solutions Corporation, Kanagawa OT (JP)

(72) Inventor: Yoichi Ootsuka, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/954,502

(22) Filed: Nov. 30, 2015

(65) Prior Publication Data

US 2016/0086995 A1 Mar. 24, 2016

Related U.S. Application Data

(63) Continuation of application No. 14/168,885, filed on Jan. 30, 2014, now Pat. No. 9,293,504.

(30) Foreign Application Priority Data

Feb. 7, 2013 (JP) .................................. 2013-022176

(51) Int. Cl.
*H04N 5/225* (2006.01)
*H01L 27/146* (2006.01)

(52) U.S. Cl.
CPC .. *H01L 27/14627* (2013.01); *H01L 27/14621* (2013.01); *H01L 27/14645* (2013.01); *H01L 27/14685* (2013.01)

(58) Field of Classification Search
CPC .. H04N 1/0306; H04N 1/1048; H04N 5/2254; H01L 27/14627
USPC .......... 348/335, 272–278, 294–308, 345, 340
See application file for complete search history.

(56) References Cited

U.S. PATENT DOCUMENTS

| | | | |
|---|---|---|---|
| 2006/0131767 A1* | 6/2006 | Wake | B29C 43/021 264/1.32 |
| 2009/0237802 A1* | 9/2009 | Yamamura | 359/622 |
| 2011/0018080 A1* | 1/2011 | Ootake | 257/432 |
| 2011/0234883 A1* | 9/2011 | Li | G02B 3/0018 348/340 |

(Continued)

*Primary Examiner* — Sinh Tran
*Assistant Examiner* — Selam T Gebriel
(74) *Attorney, Agent, or Firm* — Sheridan Ross P.C.

(57) ABSTRACT

A solid-state image pickup device includes: a filter section including filters that are disposed corresponding to respective pixels, and each allowing light of a color that corresponds to corresponding one of the pixels to transmit therethrough, in which the pixels are each configured to receive the light of the predetermined color; and a microlens array section including a plurality of microlenses each configured to collect the light for corresponding one of the pixels, in which the microlenses are stacked with respect to the filter section, and are arranged in an array pattern corresponding to the respective pixels. The microlenses have two or more shapes that are different from one another corresponding to the respective colors of the light to be received by the pixels, and each having an end that is in contact with the end of adjacent one of the microlenses.

10 Claims, 20 Drawing Sheets

(56) References Cited

U.S. PATENT DOCUMENTS

2012/0188421 A1* 7/2012 Boettiger ............. H04N 5/2254
                                              348/280
2013/0015545 A1* 1/2013 Toumiya ........... H01L 27/14605
                                              257/432

* cited by examiner

CURVATURE RADIUS: r < r'
FOCAL DISTANCE: f1 < f2

SOLID-STATE IMAGE PICKUP DEVICE, ELECTRONIC APPARATUS, AND MANUFACTURING METHOD INCLUDING VARIOUS SHAPED MICROLENSES

CROSS REFERENCE TO RELATED APPLICATIONS

This application is a continuation of U.S. patent application Ser. No. 14/168,885, filed Jan. 30, 2014, which claims priority to Japanese Patent Application No. JP 2013-022176, filed on Feb. 7, 2013, the entire disclosures of which are hereby incorporated herein by reference.

BACKGROUND

The present disclosure relates to a solid-state image pickup device, an electronic apparatus, and a manufacturing method, and more specifically to a solid-state image pickup device in which the sensitivity characteristics for each color are optimized using microlenses that are formed in a novel shape control method, to an electronic apparatus that includes such a solid-state image pickup device, and to a method of manufacturing such a solid-state image pickup device.

Recently, in a solid-state image pickup device, such as a CCD (Charge Coupled Device) sensor and a CMOS (Complementary Metal Oxide Semiconductor) sensor, a microlens has been typically formed for each pixel to improve the sensitivity characteristics. Japanese Unexamined Patent Application Publication No. H04-012568 and No. H10-148704 disclose main methods for forming the microlens.

Japanese Unexamined Patent Application Publication No. H04-012568 discloses a thermal melt flow method that is a technique for forming microlenses by forming a pattern of a microlens material made of a photosensitive resin in a photolithographic method and subsequently performing a thermal reflow of the patterned microlens material.

Japanese Unexamined Patent Application Publication No. H10-148704 discloses a dry-etching transfer method that is a technique for forming microlenses by performing an etching transfer of a photoresist mask material on a microlens material that is formed on a foundation layer of the photoresist mask material. According to the technology disclosed in Japanese Unexamined Patent Application Publication No. H10-148704, it is possible to enlarge the effective area of a microlens by reducing a gap between microlenses of adjacent pixels in a manner of optimizing various conditions for etching requirements by the use of fluorocarbon-based etching gas.

Meanwhile, in the technology disclosed in Japanese Unexamined Patent Application Publication No. H04-012568, if microlenses between adjacent pixels would make in contact with one another, a pattern of microlenses could break down due to thermal fusion. Therefore, it is necessary to form microlenses with a gap between microlenses of adjacent pixels left, which makes it difficult to improve the sensitivity of a solid-state image pickup device.

On the other hand, in the technology disclosed in Japanese Unexamined Patent Application Publication No. H10-148704, it is possible to form microlenses in such a manner that a gap between microlenses of adjacent pixels is not generated in effect by an etchback. In Japanese Unexamined Patent Application Publication No. H10-148704, however, no consideration is given to the optimization of the sensitivity characteristics for each color in a solid-state image pickup device having RGB color pixels. The same is true for Japanese Unexamined Patent Application Publication No. H04-012568.

On the contrary, Japanese Unexamined Patent Application Publication No. 2009-198547 proposes a technology of combining the above-described thermal melt flow method and dry-etching transfer method to improve the sensitivity characteristics for each color in a solid-state image pickup device having RGB color pixels.

In other words, the technology disclosed in Japanese Unexamined Patent Application Publication No. 2009-198547 combines a step of forming a microlens pattern in twice using a photosensitive resin in the thermal reflow method and a step of transferring a shape of the microlens pattern on a transparent resin layer in the dry-etching method using the microlens pattern as an etching mask. This improves the optical transmittance and light concentration performance of the microlenses, thereby allowing to raise the sensitivity of each pixel.

That is, in the technology disclosed in Japanese Unexamined Patent Application Publication No. 2009-198547, in forming a microlens pattern in twice using a photosensitive resin, the microlenses are formed in a manner of dealing with a green pixel in a Bayer array at a first formation time and dealing with red and blue pixels in a second formation time. Subsequently, a pattern of such microlenses is transferred on a transparent resin by performing dry-etching.

Here, in order to optimize the sensitivity characteristics for each color in a solid-state image pickup device having RGB color pixels, it is necessary to consider wavelength dispersion of optical refractive index so as to form a microlens pattern that is optimized for each pixel.

In the technology disclosed in Japanese Unexamined Patent Application Publication No. 2009-198547, however, microlenses to be formed corresponding to the respective red and blue pixels are formed in a microlens pattern having the same shape as one another. Therefore, such a microlens pattern is not optimized for a solid-state image pickup device having RGB color pixels.

SUMMARY

As described above, in a solid-state image pickup device having RGB color pixels, microlenses have not been typically formed to be optimized in accordance with the sensitivity characteristics for each color.

It is desirable to provide a technology capable of optimizing the sensitivity characteristics for each color using microlenses that are formed in a novel shape control method.

According to an embodiment of the present disclosure, there is provided a solid-state image pickup device including: a filter section including filters that are disposed corresponding to respective pixels, and each allowing light of a color that corresponds to corresponding one of the pixels to transmit therethrough, the pixels each being configured to receive the light of the predetermined color; and a microlens array section including a plurality of microlenses each configured to collect the light for corresponding one of the pixels, the microlenses being stacked with respect to the filter section, and being arranged in an array pattern corresponding to the respective pixels, wherein the microlenses have two or more shapes that are different from one another corresponding to the respective colors of the light to be received by the pixels, and each having an end that is in contact with the end of adjacent one of the microlenses.

According to an embodiment of the present disclosure, there is provided an electronic apparatus provided with a solid-state image pickup device. The solid-state image pickup device includes: a filter section including filters that are disposed corresponding to respective pixels, and each allowing light of a color that corresponds to corresponding one of the pixels to transmit therethrough, in which the pixels are each configured to receive the light of the predetermined color; and a microlens array section including a plurality of microlenses each configured to collect the light for corresponding one of the pixels, in which the microlenses are stacked with respect to the filter section, and are arranged in an array pattern corresponding to the respective pixels. The microlenses have two or more shapes that are different from one another corresponding to the respective colors of the light to be received by the pixels, and each having an end that is in contact with the end of adjacent one of the microlenses.

According to an embodiment of the present disclosure, there is provided a method of manufacturing a solid-state image pickup device, the method including: preparing the solid-state image pickup device, the solid-state image pickup device including a filter section including filters that are disposed corresponding to respective pixels, and each allowing light of a color that corresponds to corresponding one of the pixels to transmit therethrough, the pixels each being configured to receive the light of the predetermined color, and a microlens array section including a plurality of microlenses each configured to collect the light for corresponding one of the pixels, the microlenses being stacked with respect to the filter section, and being arranged in an array pattern corresponding to the respective pixels; and forming the microlenses to have two or more shapes that are different from one another corresponding to the respective colors of the light to be received by the pixels, and each to have an end that is in contact with the end of adjacent one of the microlenses.

In the solid-state image pickup device, the electronic apparatus, and the manufacturing method according to the above-described respective embodiments of the present disclosure, the microlenses are formed to have two or more shapes that are different from one another corresponding to the respective colors of the light to be received by the pixels, and each formed to have an end that is at least in contact with the end of adjacent one of the microlenses.

According to the solid-state image pickup device, the electronic apparatus, and the manufacturing method of the above-described respective embodiments of the present disclosure, it is possible to optimize the sensitivity characteristics of each color.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some embodiments of the present technology are described in details with reference to the drawings.

Figure 1A:
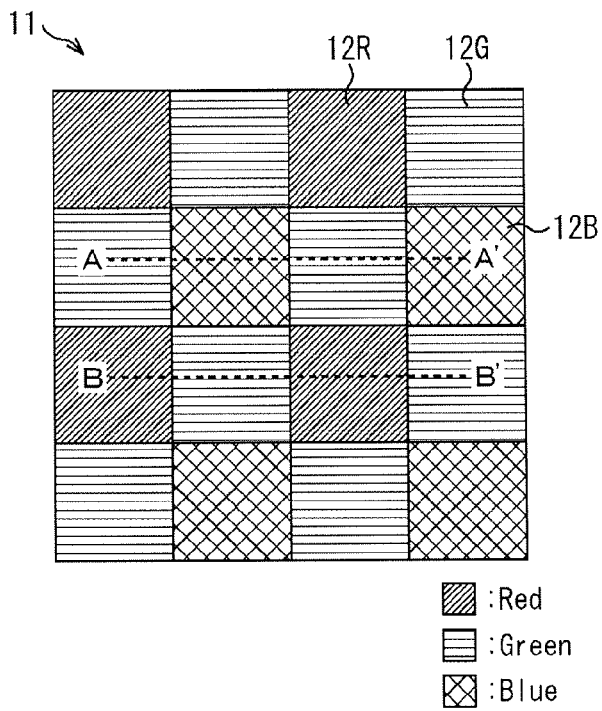
FIGS. 1A, 1B, and 1C are each a schematic diagram showing an example of a configuration of a microlens array that is formed on a solid-state image pickup device according to a first embodiment of the present technology.
Figure 1B:
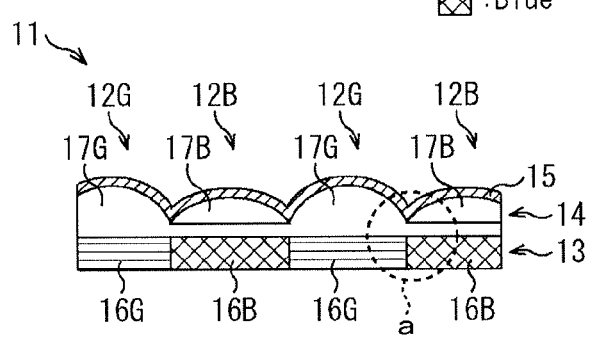
Figure 1C:
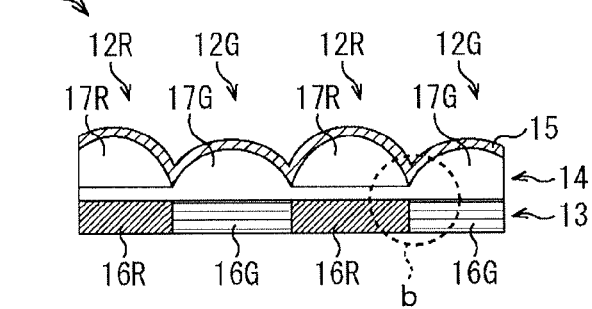

FIGS. 1A, 1B, and 1C are each a schematic diagram showing an example of a configuration of a microlens array that is formed on a solid-state image pickup device according to a first embodiment of the present technology.

FIG. 1A shows a color filter array of a solid-state image pickup device 11. Further, FIG. 1B shows an A-A' cross-sectional surface shown in FIG. 1A, and FIG. 1C shows a B-B' cross-sectional surface shown in FIG. 1A.

In the solid-state image pickup device 11, red, green, and blue filters are arranged in a so-called Bayer array, and red pixels 12R, green pixels 12G, and blue pixels 12B are arranged in accordance with the arrangement of each color. As shown in FIG. 1A, in the Bayer array, the green pixels 12G are arranged alternately every other pixel in a row direction and a column direction, and the red pixels 12R and the blue pixels 12B are arranged alternately every other pixel with the left, right, top and bottom sides thereof interposed between the green pixels 12G. It is to be noted that when there is no necessity for distinguishing among the red pixel 12R, the green pixel 12G, and the blue pixel 12B, each of such pixels is hereinafter simply referred to as a pixel 12 as appropriate.

Further, as shown in FIG. 1B and FIG. 1C, the solid-state image pickup device 11 is configured in such a manner that a color filter 13, a microlens array 14, and a microlens cover layer 15 are stacked in this order from a lower layer on a foundation layer (not shown in the drawing). The foundation layer may have an insulating layer, a light shielding film, a planarizing film, and the like that are stacked on a silicon substrate on which photodiodes are formed.

The color filter 13 is configured of red filters 16R transmitting light of red wavelength therethrough, green filters 16G transmitting light of green wavelength therethrough, and blue filters 16B transmitting light of blue wavelength therethrough that are arranged in the Bayer array as shown in FIG. 1A. In other words, in the color filter 13, rows where the green filters 16G and the blue filters 16B are alternately arranged (FIG. 1B) and rows where the green filters 16G and the red filters 16R are alternately arranged (FIG. 1C) are arranged one after the other in a column direction.

The microlens array 14 is configured of red pixel microlenses 17R, green pixel microlenses 17G, and blue pixel microlenses 17B that are arranged in an array pattern. The red pixel microlens 17R collects light to be applied to a red pixel 12R, and is arranged at a location corresponding to the red filter 16R. The green pixel microlens 17G collects light to be applied to a green pixel 12G, and is arranged at a location corresponding to the green filter 16G. Similarly, the blue pixel microlens 17B collects light to be irradiated to a blue pixel 12B, being arranged at a location corresponding to the blue filter 16B. It is to be noted that when there is no necessity for distinguishing among the red pixel microlens 17R, the green pixel microlens 17G, and the blue pixel microlens 17B, each of such microlenses is hereinafter simply referred to as a microlens 17 as appropriate.

The microlens cover layer 15 is stacked with respect to the microlens array 14, and assures the adhesiveness of the red pixel microlens 17R and the blue pixel microlens 17B to a foundation layer, and functions as an antireflective film for reducing surface reflection of the microlenses 17.

Here, in the solid-state image pickup device 11, the red pixel microlens 17R, the green pixel microlens 17G, and the blue pixel microlens 17B are formed by controlling curvature radii thereof in such a manner that these microlenses take shapes different from one another to optimize the sensitivity characteristics of each color.

Figure 2A:
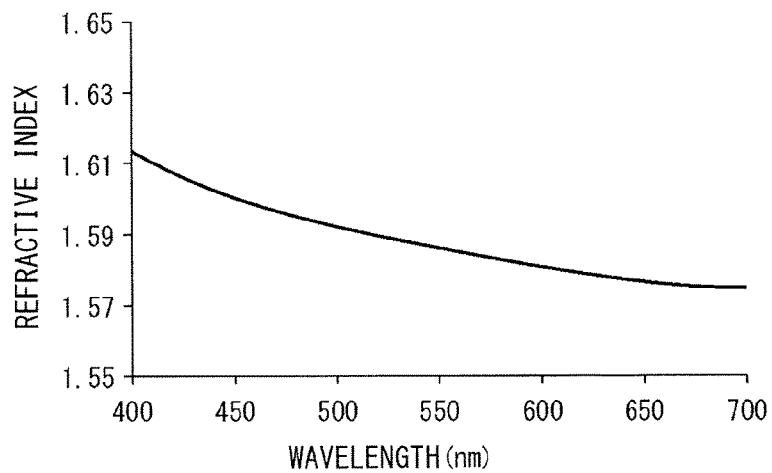
FIGS. 2A and 2B are each a graph and a schematic diagram showing the wavelength dispersion characteristics of refractive index and a shape of a microlens for each color, respectively.

As shown in an example in FIG. 2A, the wavelength dispersion of refractive index of a transparent resin made of a phenolic material, which may be used for forming the microlens 17, may have characteristics indicating that the refractive index is higher at the shorter wavelength side, and becomes lower toward the longer wavelength side.

Figure 2B:
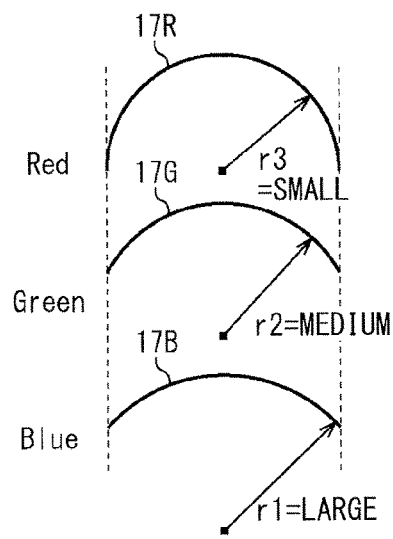

To optimize the sensitivity characteristics of each color based on such characteristics, as shown in FIG. 2B, a curvature radius r1 of the blue pixel microlens 17B at the short wavelength side with high refractive index is formed in the largest size. A curvature radius r2 of the green pixel microlens 17G is formed in a size smaller than the curvature radius r1 of the blue pixel microlens 17B, and a curvature radius r3 of the red pixel microlens 17R at the long wavelength side with low refractive index is formed in the smallest size.

Further, in the solid-state image pickup device 11, to achieve the high sensitivity, the microlenses 17 in the microlens array 14 are formed in such a manner that ends of the adjacent microlenses 17 come in contact with one another, or a part of one end runs on another end.

Figure 3A:
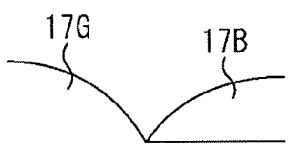
FIGS. 3A and 3B are each a schematic diagram showing details of a configuration between ends of the adjacent microlenses.
Figure 3A:
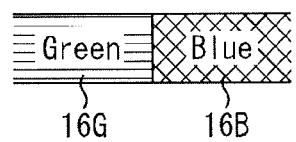
Figure 3B:
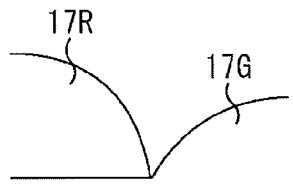
Figure 3B:
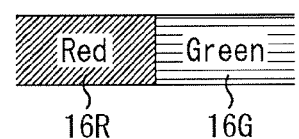
Figure 4A:
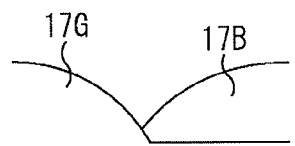
FIGS. 4A and 4B are each a schematic diagram showing details of another configuration between ends of the adjacent microlenses.
Figure 4A:
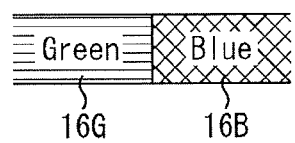
Figure 4B:
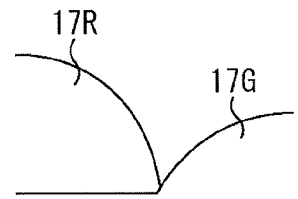
Figure 4B:
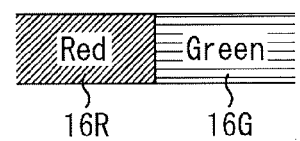

Here, with reference to FIGS. 3A and 3B as well as FIGS. 4A and 4B, the description is provided on ends between the microlenses 17 that configure the microlens array 14.

FIG. 3A shows an enlarged view of a region "a" denoted with a dashed line in FIG. 1B, and FIG. 3B shows an enlarged view of a region "b" denoted with a dashed line in FIG. 1C.

As shown in FIG. 3A, an end of the green pixel microlens 17G and an end of the blue pixel microlens 17B are formed to come in contact with one another. Further, as shown in FIG. 3B, the end of the green pixel microlens 17G and an end of the red pixel microlens 17R are formed to come in contact with one another.

Further, besides the method in which the microlenses 17 are formed in such a manner that ends of the adjacent microlenses 17 come in contact with one another, the microlenses 17 may be also formed in such a manner that an end of one microlens 17 runs on another end of the other microlens 17.

As with FIGS. 3A and 3B, FIG. 4A shows an enlarged view of a region "a" denoted with a dashed line in FIG. 1B, and FIG. 4B shows an enlarged view of a region "b" denoted with a dashed line in FIG. 1C.

As shown in FIG. 4A, the microlenses 17 are formed in such a manner that an end of the blue pixel microlens 17B runs on an end of the green pixel microlens 17G. Further, as shown in FIG. 4B, the microlenses 17 are formed in such a manner that an end of the red pixel microlens 17R runs on the end of the green pixel microlens 17G.

As described above, in the solid-state image pickup device 11, the curvature radii of the red pixel microlens 17R, the green pixel microlens 17G, and the blue pixel microlens 17B are formed corresponding to the respective sensitivity characteristics of the red pixel 12R, green pixel 12G, and blue pixel 12B. Further, in the solid-state image pickup device 11, the microlenses 17 are formed in such a manner that ends of the adjacent microlenses 17 come in contact with one another, or a part of one end runs on another end.

As a result, in the solid-state image pickup device 11, it is possible to optimize the sensitivity characteristics for each of the red pixel 12R, green pixel 12G, and blue pixel 12B, as well as to achieve the high sensitivity. Therefore, in the solid-state image pickup device 11, it is possible to take images of higher quality than before.

Figure 5:
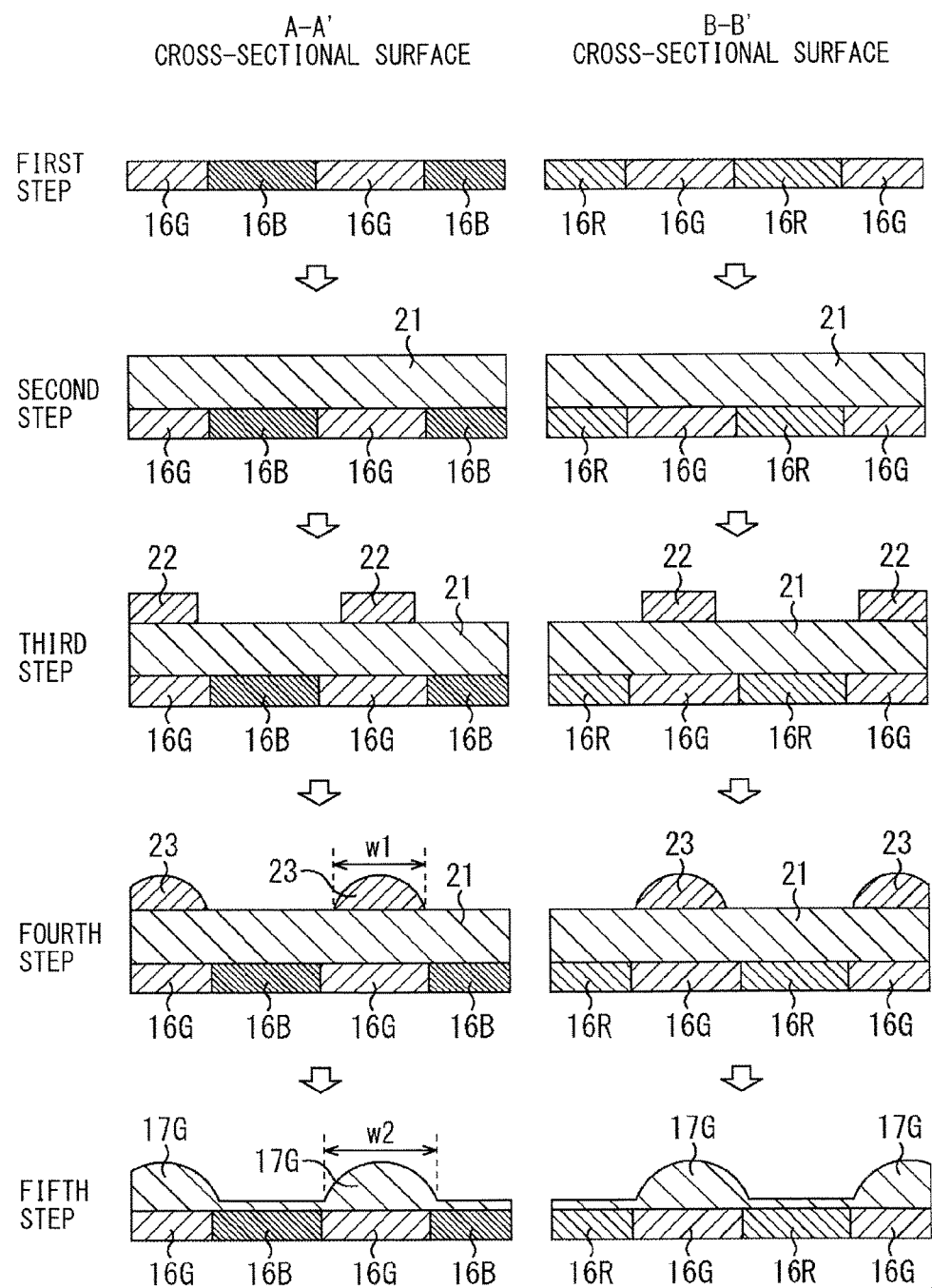
FIG. 5 shows cross-sectional views for explaining a method of manufacturing the microlenses that are formed corresponding to respective colors of the solid-state image pickup device.
Figure 6:
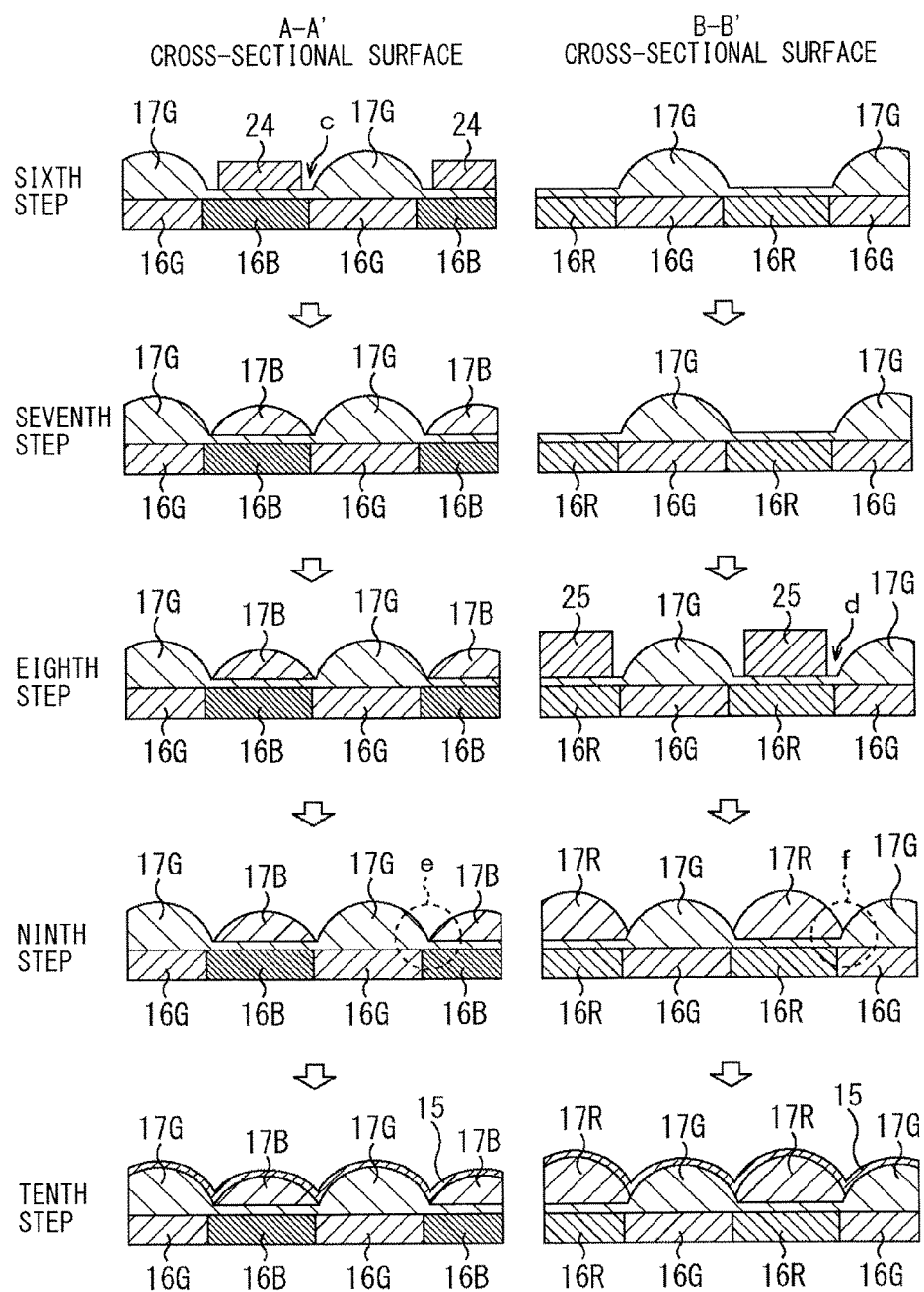
FIG. 6 shows cross-sectional views for explaining a method of manufacturing the microlenses that are formed corresponding to respective colors of the solid-state image pickup device.

Next, with reference to FIG. 5 and FIG. 6, the description is provided on a method of manufacturing the microlenses 17 that are formed corresponding to the respective colors of the solid-state image pickup device 11. It is to be noted that the A-A' cross-sectional surfaces illustrated in FIG. 1A are shown on the left side in each of FIG. 5 and FIG. 6, while the B-B' cross-sectional surfaces illustrated in FIG. 1A are shown on the right side in each of FIG. 5 and FIG. 6.

First, in a first step, the color filter 13 that is configured of the red filters 16R, the green filters 16G, and the blue filters 16B is stacked on a foundation layer (not shown in the drawing) of the solid-state image pickup device 11.

Subsequently, in a second step, a transparent microlens material 21 which may be made of, for example, a phenolic resin is formed on the color filter 13. Examples of the phenolic resin may include a styrene-based resin and styrene-acrylic copolymer-based resin.

Next, in a third step, photoresists 22 that are patterned corresponding to locations where the green filters 16G are placed are formed on the microlens material 21. For example, the photoresists 22, for which positive resists which may be made mostly of novolac-based resin may be used, may be formed using a known photolithographic method. It is to be noted that patterns for the respective photoresists 22 are each formed in an isolated state, and the patterns for the photoresists 22 that are placed adjacent to one another in an oblique direction are also formed to be split as described later with reference to FIGS. 8A, 8B, and 8C.

Thereafter, in a fourth step, a thermal treatment exceeding a thermal softening point (a temperature within a range of about 140 to about 180 degrees centigrade) of the photoresist 22 is carried out. The patterns for the photoresists 22 are deformed by such a thermal treatment, and then patterns for photoresists 23 in the lens shape are thus formed. It is to be noted that the patterns for the respective photoresists 23 that take the lens shape as a result of the thermal treatment are each formed in an isolated state, and the patterns for the photoresists 23 that are placed adjacent to one another in an oblique direction are also formed to be split as with the patterns for the photoresists 22.

Afterward, in a fifth step, the green pixel microlenses 17G are formed in such a manner that the photoresists 23 in the lens shape are used as a mask material, and the shape is transferred in an etching technique on the transparent microlens material 21 that is formed as a foundation layer. On this occasion, an etching transfer is so carried out as to increase the effective area of the green pixel microlens 17G by contriving the etching conditions by the use of fluorocarbon-based etching gas. In other words, the formation is so carried out that a width w1 of the photoresist 23 that takes the lens shape increases, and a width w2 of the green pixel microlens 17G after the etching transfer is completed is formed to be greater than the w1 (w1<w2).

Examples of the dry-etching conditions in the fifth step may preferably include use of microwave plasma etching equipment, a magnetron power of about 1100 W, a bias power of about 40 W, etching gas 1 of SF6 (flow rate of about 300 SCCM), etching gas 2 of C4F8 (flow rate of about 100 SCCM), etching gas 3 of Ar (flow rate of about 25 SCCM), an electrode temperature of about minus 30 degrees centigrade, and an etching indoor pressure of about 2 Pa.

It is to be noted that the etching equipment is not limited to the microwave plasma etching equipment, and any other high-density plasma etching equipment and the like may be alternatively used, such as parallel flat-type RIE equipment, high-pressure narrow-gap type plasma etching equipment, ECR-type etching equipment, transformer coupling plasma etching equipment, inductive coupling plasma etching equipment, and helicon wave plasma etching equipment. Further, etching gas types are not limited to the SF6, C4F8, and Ar, and fluorocarbon-based gas such as CF4, C2F6, C3F8, CH2F2, and CHF3 may be used independently, or any gas that may be made by the addition of He or N2 gas in any of the above-described gases may be used alternatively.

Next, as shown in FIG. 6, in a sixth step, microlens materials 24 made of positive photosensitive resin are formed corresponding to locations where the blue filters 16B are placed. The microlens material 24 may be formed in a known photolithographic technique using i-beam (light with wavelength of about 365 nm) for exposure light, for example. Here, as shown in FIG. 6, the microlens material 24 is formed with spacing clearances "c" interposed between ends of the green pixel microlenses 17G, and is formed in a smaller region than the green pixel microlens 17G.

It is to be noted that, for the microlens material 24 for which the pattern exposure and development treatment has been completed, an unexposed photosensitive material, for example, a diazo naphthoquinone-based photosensitive material may be present in the pattern thereof. Consequently, the photosensitive material has light absorption at short wavelength side of visible light, which may deteriorate the sensitivity characteristics of the solid-state image pickup device 11. Accordingly, it is possible to reduce the light absorption by performing an exposure (bleaching exposure) using i-beam for the photoresist pattern having the light absorption.

Subsequently, in a seventh step, a thermal treatment exceeding a thermal softening point (a temperature within a range of about 140 to about 180 degrees centigrade) of the microlens material 24 is carried out to shape the microlens material 24 made of positive photosensitive resin in the lens form, thereby forming the blue pixel microlens 17B. On this occasion, an additional thermal treatment at a temperature within a range of about 190 to about 240 degrees centigrade may be performed to further increase the hardenability of the microlens material 24.

Thereafter, in an eighth step, microlens materials 25 made of positive photosensitive resin are formed corresponding to locations where the red filters 16R are placed. The microlens materials 25 may be formed in a known photolithographic technique using i-beam for exposure light, for example. Here, as shown in FIG. 6, the microlens material 25 is formed with spacing clearances "d" interposed between ends of the green pixel microlenses 17G, and is formed in a smaller region than the green pixel microlens 17G.

It is to be noted that, in the eighth step as well, as with the sixth step, the bleaching exposure may be carried out for the microlens material 25 for which the pattern exposure and development treatment has been completed to reduce the light absorption.

Afterward, in a ninth step, a thermal treatment exceeding a thermal softening point (a temperature within a range of about 140 to about 180 degrees centigrade) of the microlens material 25 is carried out to shape the microlens material 25 made of positive photosensitive resin in the lens form, thereby forming the red pixel microlens 17R.

As described above, after the green pixel microlens 17G is formed, the blue pixel microlens 17B is formed, and then the red pixel microlens 17R is formed. On this occasion, as mentioned with reference to FIGS. 3A and 3B, formation of the blue pixel microlens 17B is controlled in such a manner that an end of the blue pixel microlens 17B comes in contact with an end of the adjacent green pixel microlens 17G (a region "e" denoted with a dashed line in FIG. 6). Similarly, formation of the red pixel microlens 17R is controlled in such a manner that an end of the red pixel microlens 17R comes in contact with an end of the adjacent green pixel microlens 17G.

Alternatively, as described with reference to FIGS. 4A and 4B, formation of the red pixel microlens 17R is controlled in such a manner that an end of the red pixel microlens 17R runs on an end of the adjacent green pixel microlens 17G (a region "f" denoted with a dashed line in FIG. 6). Similarly, formation of the blue pixel microlens 17B is controlled in such a manner that an end of the blue pixel microlens 17B runs on an end of the adjacent green pixel microlens 17G.

Subsequently, in a tenth step, the microlens cover layer 15 is formed. The microlens cover layer 15 is formed to at least cover the blue pixel microlenses 17B and the red pixel microlenses 17R that are formed on the surface for which the dry-etching transfer is performed using fluorocarbon-based etching gas. Therefore, it is possible to assure the adhesiveness of each of the blue pixel microlenses 17B and the red pixel microlenses 17R to the microlens material 21. Further, the microlens cover layer 15 also functions as an antireflective film for reducing the surface reflection of the microlens material.

Here, the description is provided on the adhesiveness of the blue pixel microlenses 17B and the red pixel microlenses 17R. As described above, the green pixel microlenses 17G are formed in the dry-etching transfer method using the fluorocarbon-based etching gas. This causes fluorine to be present on a surface of the microlens material 21 that is formed by an etching step, and the fluorine may deteriorate the adhesiveness of the blue pixel microlenses 17B and the red pixel microlenses 17R that are formed thereon. In this case, for example, in an assembly step to be performed after formation of the microlenses 17, there may be a possibility that a defect such as film peel-off could occur.

Further, the refractive index of the microlens material 21 made of phenolic resin that may be used for forming the green pixel microlens 17G is in the order of about 1.59 as shown in FIG. 2A. On this occasion, the optical surface reflectivity of the microlens material 21 is in the order of about 5.2%. Further, the refractive index for each of the photoresists 22 and 23 that are used for forming the blue pixel microlens 17B and the red pixel microlens 17R is equivalent to the above-described refractive index because such photoresists may also use the phenolic resin.

The microlens material 21, the photoresists 22 and 23 are formed as appropriate for reduction of such reflectivity, thereby allowing to reduce the surface reflectivity thereof, which makes it possible to improve the sensitivity characteristics of the solid-state image pickup device 11 and the flare characteristics.

Further, the microlens cover layer 15 that functions as an antireflective film may be preferably formed in a single layer using, for example, a silicon oxide film (SiO: refractive index of about 1.45) with a thickness of about 100 nm. Further, in the case of a two-layered configuration, a silicon nitride film (SiN: refractive index of about 1.9) or a silicon oxynitride (SiON: refractive index of about 1.8) may be formed on the microlens array 14, and a silicon oxide film and the like may be formed thereon.

In such a manner, the microlens cover layer 15 has the functionality of improving the adhesiveness of the blue pixel microlenses 17B and the red pixel microlenses 17R, and the functionality as the antireflective film.

As described above, the green pixel microlenses 17G, the red pixel microlenses 17R, and the blue pixel microlenses 17B are formed corresponding to the respective colors of the solid-state image pickup device 11.

Figure 7A:
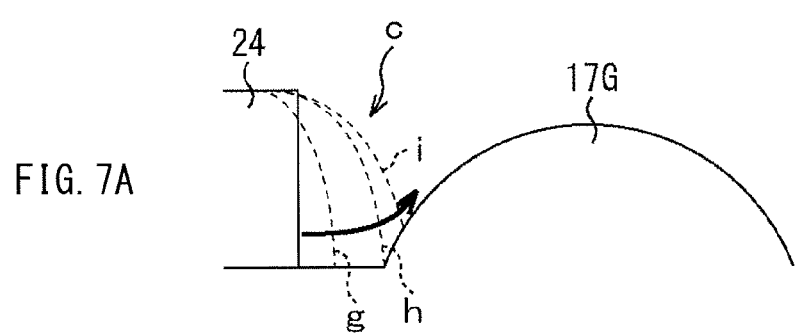
FIGS. 7A and 7B are each a schematic diagram for explaining a method of forming a blue pixel microlens and a red pixel microlens by controlling shapes thereof.
Figure 7B:
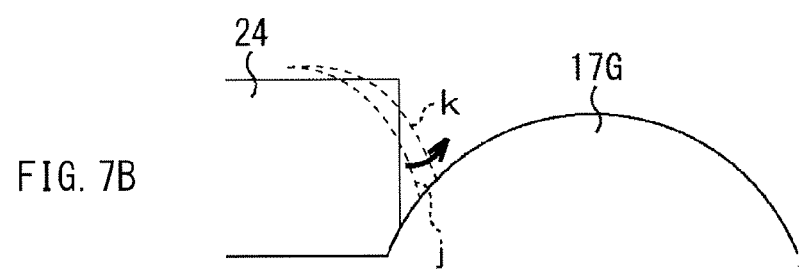

Here, with reference to FIGS. 7A and 7B, the description is provided on a method of forming the blue pixel microlens 17B and the red pixel microlens 17R by controlling the shapes thereof.

As already described in the sixth step (FIG. 6), a state is shown in FIG. 7A where the microlens material 24 is formed with the spacing clearances "c" interposed between ends of the green pixel microlenses 17G. Here, the description is provided on an example where the blue pixel microlens 17B is formed in the seventh step. It is to be noted that the same is true for formation of the red pixel microlens 17R (the eighth and ninth steps).

FIG. 7A shows states denoted by dashed lines g, h, and i, where an end of the pattern for the microlens material 24 is moving due to a thermal flow of the microlens material 24 when a thermal treatment exceeding a thermal softening point of the microlens material 24 is performed in the seventh step.

More specifically, in the thermal treatment, to start with, a position of the pattern for the microlens material 24 moves from a dashed line "g" to a dashed line "h". On this occasion, in the course of moving from the dashed line "g" to the dashed line "h", the mobility of an end of the microlens material 24 is relatively large. Subsequently, at the point of time when the end of the pattern for the microlens material 24 has reached a position of the dashed line "h", that is, at the point of time when the end of the pattern for the microlens material 24 has reached an end of the green pixel microlens 17G, the mobility becomes small.

Thereafter, when the thermal flow is further progressed, and the end of the pattern for the microlens material 24 moves from the dashed line "h" to a dashed line "i", the mobility becomes small as well because of movement over a curved surface of the green pixel microlens 17G. In other words, a structure of the green pixel microlens 17G functions as a base material for self-control at the time of thermal reflow of the microlens material 24 in the formation of the blue pixel microlens 17B.

Further, FIG. 7B shows a state where the microlens material 24 is so formed as to beforehand run on an end of the green pixel microlens 17G without interposing the above-described spacing clearances "c" between.

Here, the green pixels 12G are so formed as to surround the red pixels 12R and the blue pixels 12B (see FIG. 1A). First, the green pixel microlens 17G is formed using the etching transfer method in a manner of increasing a pattern size such that the effective area thereof is enlarged, and thereafter the blue pixel microlens 17B and the red pixel microlens 17R are formed in a thermal reflow method. At this time, as shown in FIG. 7B, a position of the end of the pattern for the microlens material 24 moves from a dashed line "j" to a dashed line "k".

On this occasion, the self-alignment utilizing the green pixel microlens 17G allows to optimize formation of the blue pixel microlens 17B including the curvature radius thereof.

Figure 8A:
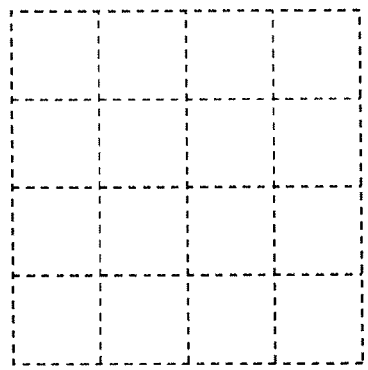
FIGS. 8A, 8B, and 8C are each a plan view for explaining a method of manufacturing the microlenses.
Figure 8B:
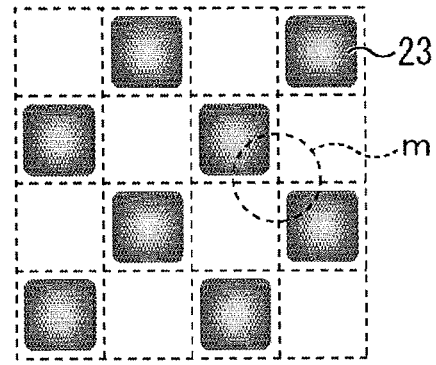
Figure 8C:
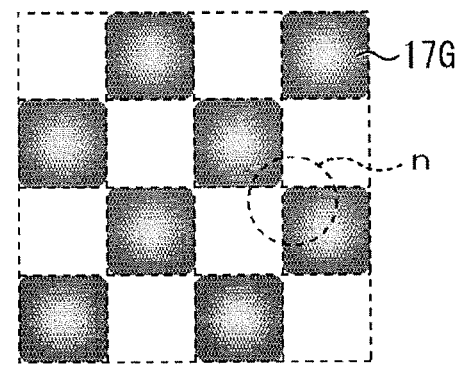
Figure 9A:
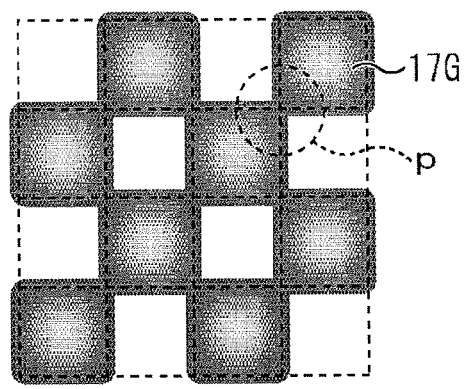
FIGS. 9A and 9B are each a plan view for explaining a method of manufacturing the microlenses.
Figure 9B:
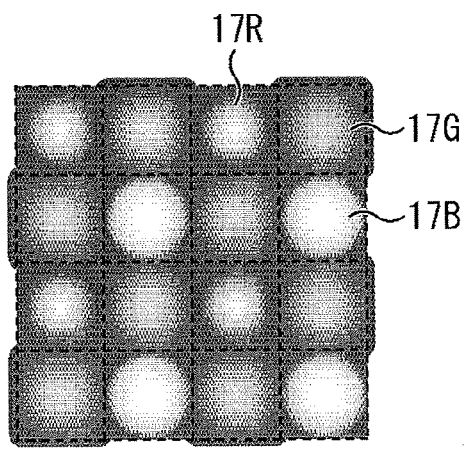

Here, with reference to planar views of the pixel array as shown in FIGS. 8A, 8B, and 8C as well as FIGS. 9A and 9B, the description is provided on formation of the microlenses 17 with respect to pixel boundary portions of the solid-state image pickup device 11.

FIG. 8A shows the boundary portions of the pixels 12 with dashed lines.

FIG. 8B shows patterns of the photoresists 23 that are formed on the microlens material 21 in accordance with the fourth step described above with reference to FIG. 5 and are shaped in the lens form by the thermal treatment. Further, as denoted with a dashed line "m" in FIG. 8B, a spacing clearance is provided between patterns of the photoresists 23 that are placed adjacent to one another in an oblique direction. This spacing clearance is for avoiding occurrence of a pattern collapse that may be caused due to contact of the patterns that are placed adjacent to one another in an oblique direction by the thermal treatment. As described in the third step in FIG. 5, a spacing clearance is provided between patterns of the photoresists 23 that are shaped in the lens form, by forming the patterns of the photoresists 23 in the isolated state.

FIG. 8C shows a state where the green pixel microlenses 17G are formed by using the patterns of the photoresists 23 as a mask to perform etching transfer on the microlens material 21 that is formed on a foundation layer of the photoresists 23. In FIG. 8C, sides of the green pixel microlens 17G are kept to coincide with pixel borderlines, and the green pixel microlens 17G is formed in the round shape at corners of a square. Therefore, as denoted with a dashed line "n", a spacing clearance is present between the green pixel microlenses 17G that are placed adjacent to one another in an oblique direction.

Here, to achieve the high sensitivity of the solid-state image pickup device 11, it is preferable to enlarge the effective area of the microlens 17. Accordingly, as shown in FIG. 8C, presence of a spacing clearance in an oblique direction as well would cause the sensitivity to deteriorate. Therefore, to further improve the sensitivity characteristics of the solid-state image pickup device 11, the green pixel microlenses 17G may be formed by extending the etching transfer to ensure that the green pixel microlenses 17G in an oblique direction come in contact with one another as denoted with a dashed line "p" in FIG. 9A. As shown in FIG. 1A, the green pixels 12G are formed to surround the red pixels 12R and the blue pixels 12B, and thus it is possible to form the green pixel microlenses 17G without defeating the symmetry thereof even when the green pixel microlenses 17G are formed by extending the etching transfer.

FIG. 9B shows a state where the blue pixel microlenses 17B and the red pixel microlenses 17R are formed tightly in a planar view through self-alignment by the thermal treatment using the microlens materials 24 and 25. Further, curvature radii of the blue pixel microlens 17B and the red pixel microlens 17R are formed to have a relationship as shown in FIG. 2B (r1>r2>r3) by adjusting coating film thicknesses of the microlens materials 24 and 25.

Next, the description is provided on a microlens array that is formed on a solid-state image pickup device according to second embodiment of the present technology.

A solid-state image pickup device 11A includes image pickup pixels for constructing images and pixels for autofocusing that utilizes an imaging plane phase difference (hereinafter referred to as AF pixels as appropriate). A microlens array 14A is formed with AF pixel microlenses 18 corresponding to the AF pixels. It is to be noted that, in the following description, image pickup pixel microlenses for constructing images, that is, the red pixel microlenses 17R, the green pixel microlenses 17G, and the blue pixel microlenses 17B are each referred to as an image pickup pixel microlens 17 without distinguishing among these microlenses.

Figure 10:
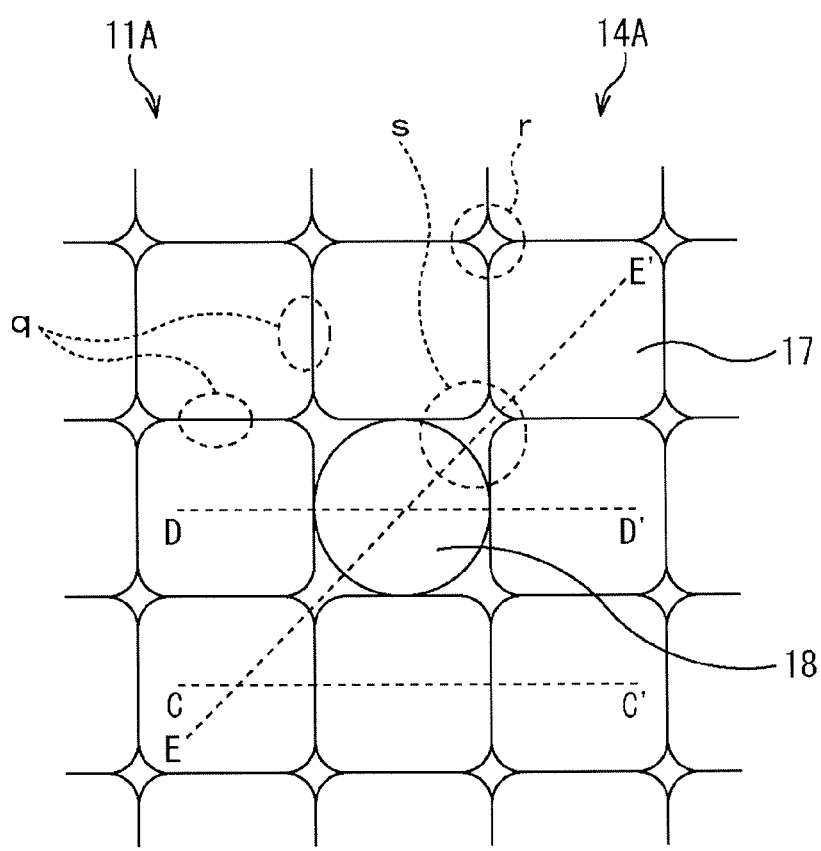
FIG. 10 is a schematic diagram showing an example of a configuration of a microlens array according to a second embodiment.

As shown in FIG. 10, the image pickup pixel microlens 17 is formed in the round shape at corner sections of a square in a planar view thereof. Further, the AF pixel microlens 18 is virtually in the round shape in a planar view thereof, and is formed at least to come in contact with a center of a side face of each of the image pickup pixel microlenses 17 that surround the AF pixel microlens 18.

Further, as denoted with a dashed line "q" in FIG. 10, an array of the image pickup pixel microlenses 17 is so formed in a dry-etching method that side faces of the image pickup pixel microlenses 17 that are placed adjacently in a vertical direction and a horizontal direction come in contact with one another. On this occasion, as denoted with a dashed line "r", a gap is present between corner sections of the image pickup pixel microlenses 17 that are placed adjacently in an oblique direction. Further, as denoted with a dashed line "s", at a corner section between the image pickup pixel microlens 17 and the AF pixel microlens 18, there is a larger gap than the gap between corner sections of the image pickup pixel microlenses 17.

Figure 11:
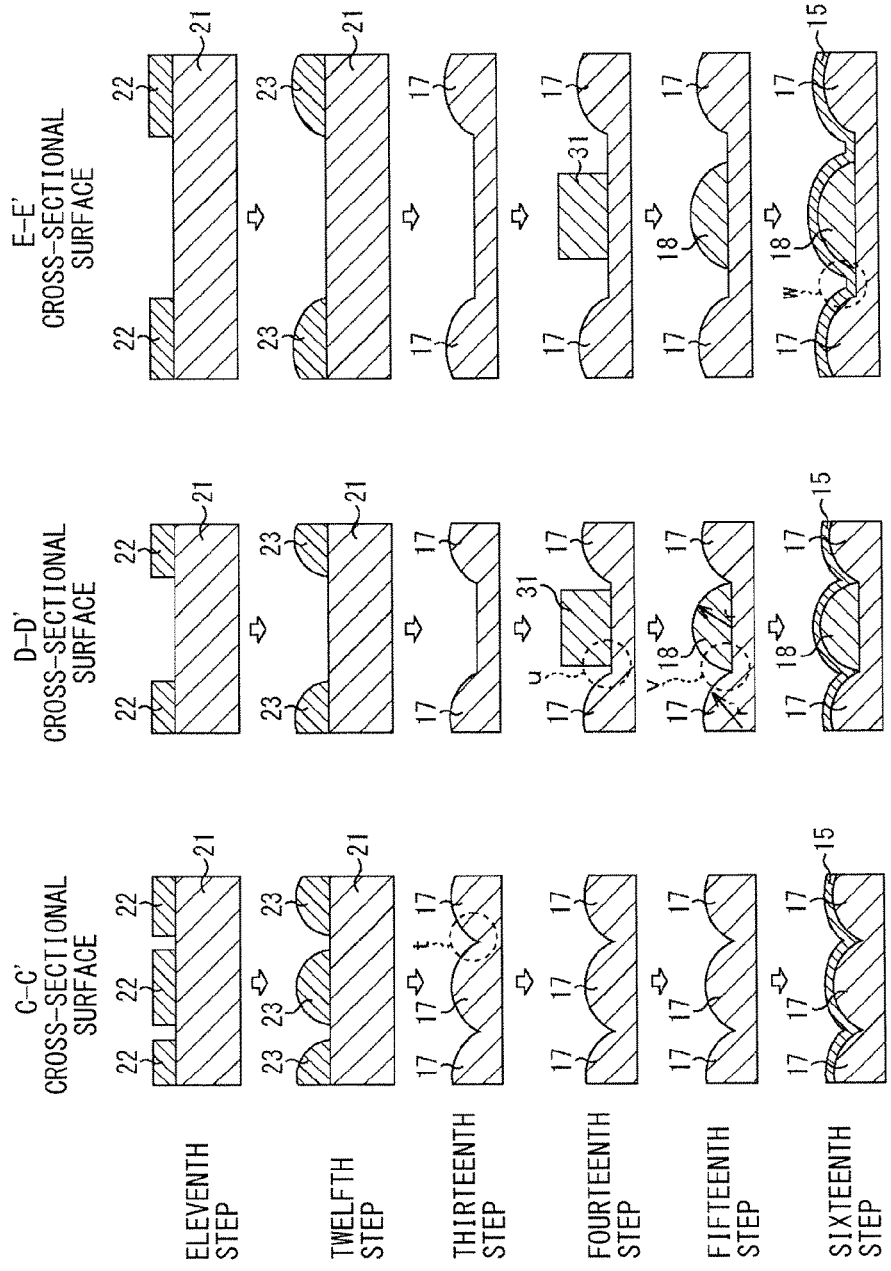
FIG. 11 shows cross-sectional views for explaining a second method of manufacturing the microlens array.

Next, with reference to FIG. 11, the description is provided on a method of manufacturing the microlens array 14A. It is to be noted that the C-C' cross-sectional surfaces represented in FIG. 10 are shown on the left side of FIG. 11, the D-D' cross-sectional surfaces represented in FIG. 10 are shown in the middle of FIG. 11, and the E-E' cross-sectional surfaces represented in FIG. 10 are shown on the right side of FIG. 11.

First, in eleventh to thirteenth steps, the image pickup pixel microlenses 17 are formed by performing the treatments similar to the treatments that are described above with reference to FIG. 5 and FIG. 6. More specifically, the resist patterning is performed corresponding to the image pickup pixel microlenses 17 in the eleventh step, the thermal reflow is performed in the twelfth step, and the etch-back is performed in the thirteenth step. In such steps, the image pickup pixel microlenses 17 are formed.

Figure 12A:
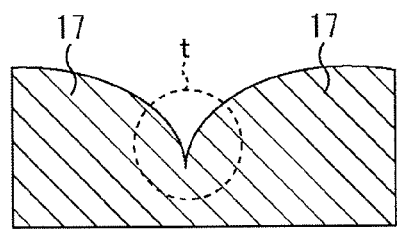
FIGS. 12A, 12B, 12C, and 12D are each a schematic diagram showing details of still another configuration between ends of the adjacent microlenses.

On this occasion, as shown in a region "t" denoted with a dashed line in FIG. 11, the image pickup pixel microlenses 17 are so formed in the dry-etching method that portions in side directions of ends of the image pickup pixel microlenses 17 that are placed adjacently in a horizontal direction come in contact with one another. Similarly, the dry-etching is so performed that portions in side directions of ends of the image pickup pixel microlenses 17 that are placed adjacently in a vertical direction also come in contact with one another, which is not shown in the drawing. It is to be noted that FIG. 12A shows an enlarged view of a portion corresponding to the region "t" denoted with a dashed line.

Figure 12B:
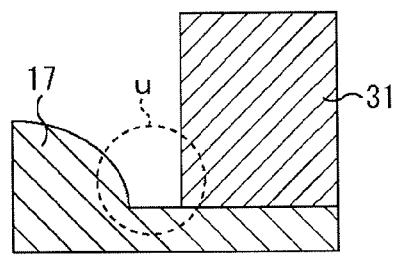

Next, in a fourteenth step, a microlens material 31 is formed at a location where the AF pixel microlens 18 is formed. On this occasion, as shown in a region "u" denoted with a dashed line in FIG. 11, a gap is provided between the microlens material 31 and the adjacent image pickup pixel microlenses 17. It is to be noted that FIG. 12B shows an enlarged view of a portion corresponding to the region "u" denoted with a dashed line.

Figure 13A:
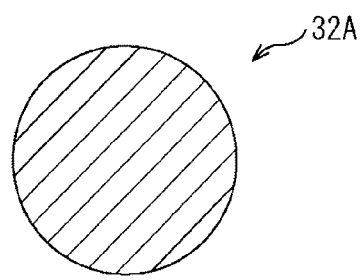
FIGS. 13A and 13B are each a schematic diagram showing a shape of a photomask for forming an AF pixel microlens pattern.
Figure 13B:
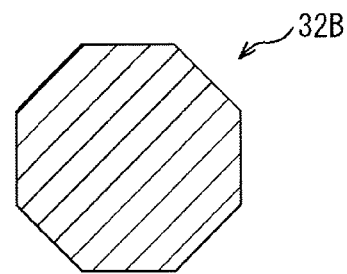

On this occasion, for the shape of a photomask to be used for forming a pattern of the microlens material 31, a pattern in the shape where a circular chromium photomask 32A (FIG. 13A) or an octagonal chromium photomask 32B (FIG. 13B) in an planar view is left is used.

Figure 12C:
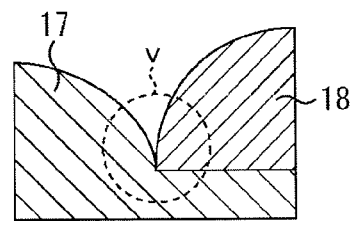

Subsequently, in a fifteen step, a thermal treatment exceeding a thermal softening point (a temperature within a range of about 140 to about 180 degrees centigrade) of the microlens material 31 is carried out to shape the microlens material 31 made of positive photosensitive resin in the lens form, thereby forming the AF pixel microlens 18. On this occasion, as shown in a region "v" denoted with a dashed line in FIG. 11, the AF pixel microlens 18 is formed in such a manner that the AF pixel microlens 18 comes in contact with center portions of side faces of the image pickup pixel microlenses 17 surrounding the AF pixel microlens 18 to avoid formation of a gap. It is to be noted that FIG. 12C shows an enlarged view of a portion corresponding to the region "v" denoted with a dashed line.

Further, a thickness of a coating film for the microlens material 31 is adjusted to ensure that a curvature radius r of the AF pixel microlens 18 is formed in a smaller size than a curvature radius r' of the image pickup pixel microlens 17.

Figure 12D:
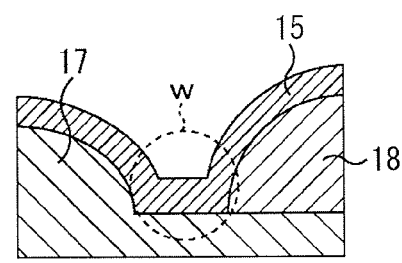

Thereafter, in a sixteenth step, the microlens cover layer 15 is formed as with the above-described tenth step. It is to be noted that, in the E-E' cross-sectional surface, as shown in a region "w" denoted with a dashed line, a gap is provided between the AF pixel microlens 18 and the image pickup pixel microlens 17 that is placed adjacently in an oblique direction. FIG. 12D shows an enlarged view of a portion corresponding to the region "w" denoted with a dashed line.

Figure 14A:
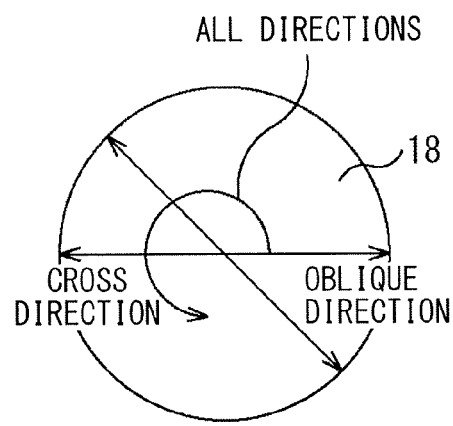
FIGS. 14A, 14B, and 14C are each a schematic diagram for explaining a curvature radius of the AF pixel microlens.
Figure 14B:
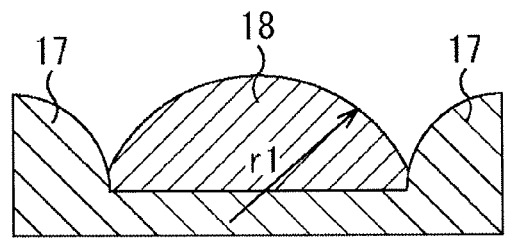
Figure 14C:
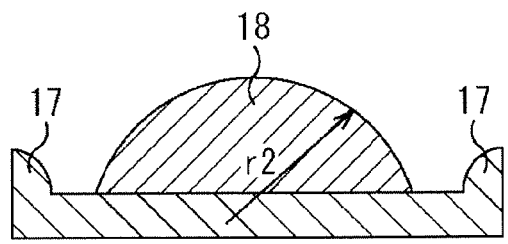

The microlens array 14A may be manufactured in the above-described manufacturing method, and the AF pixel microlens 18 is formed in such a manner the curvature radius becomes equal virtually in all circumferential directions as shown in FIGS. 14A, 14B, and 14C.

More specifically, as described above, for the shape of the microlens material 31 made of positive photosensitive resin that may be formed using the circular photomask 32A or the octagonal photomask 32B, the microlens material 31 is formed virtually in the circular shape in a planar view thereof (formed in the circular shape due to going through the exposure, development, thermal treatment even if formed using the octagonal photomask 32B). On this occasion, the image pickup pixel microlenses 17 are formed in advance in a vertical direction and a horizontal direction of the AF pixel microlens 18. Consequently, the image pickup pixel microlenses 17 function as a base material for the self-alignment, which improves the controllability in forming the AF pixel microlens 18. It is to be noted that, as described above with reference to FIGS. 4A and 4B, the AF pixel microlens 18 may be formed in such a manner that an end of the AF pixel microlens 18 runs on an end of the image pickup pixel microlenses 17.

As shown in FIGS. 14A, 14B, and 14C, for a cross-sectional view of the AF pixel microlens 18, a length is virtually the same in a cross direction and in an oblique direction (all directions) in a planar view, and thus each curvature radius becomes virtually equal (r1≈r2) by forming the AF pixel microlens 18 in a manner of performing a thermal treatment exceeding a thermal softening point.

Figure 15A:
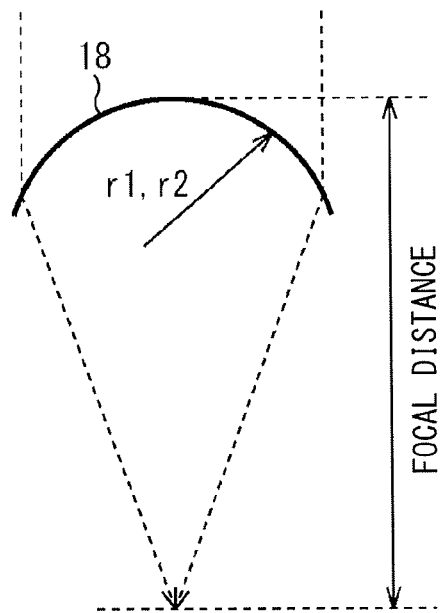
FIGS. 15A and 15B are each a schematic diagram for explaining a focal distance of the microlens.
Figure 15B:
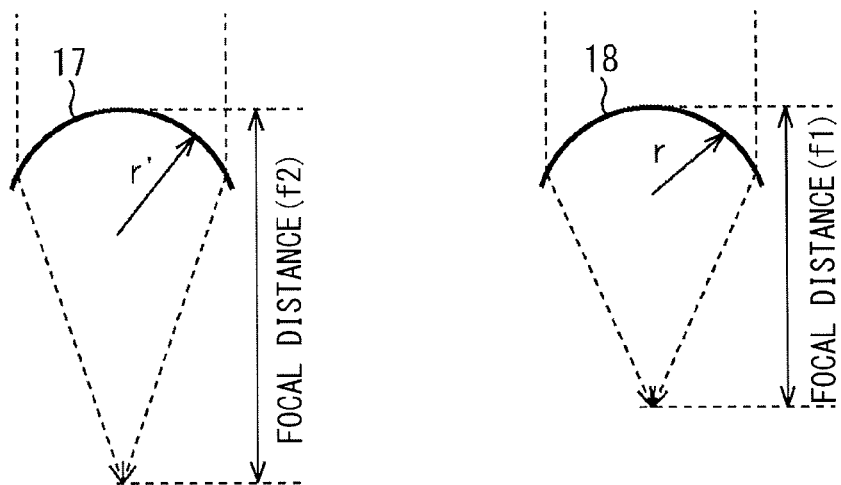

Accordingly, as shown in FIG. 15A, a focal distance of the AF pixel microlens 18 the curvature radius of which is formed equally in essence becomes equal virtually in a cross direction and in an oblique direction (all directions). Further, as shown in FIG. 15B, the curvature radius r of the AF pixel microlens 18 is smaller than the curvature radius r' of the image pickup pixel microlens 17 (r<r'), and a focal distance f1 of the AF pixel microlens 18 becomes shorter than a focal distance f2 of the image pickup pixel microlens 17 (f1<f2).

As described above, in the solid-state image pickup device 11A, the curvature radius of the AF pixel microlens 18 becomes substantially the same in a side direction and in an oblique direction, thereby allowing to improve the separation performance of an image plane phase difference AF. Here, with reference to FIGS. 16A and 16B as well as FIGS. 17A and 17B, the description is provided on the capability of improving the separation performance of the image plane phase difference AF by means of the AF pixel microlens 18.

Figure 16A:
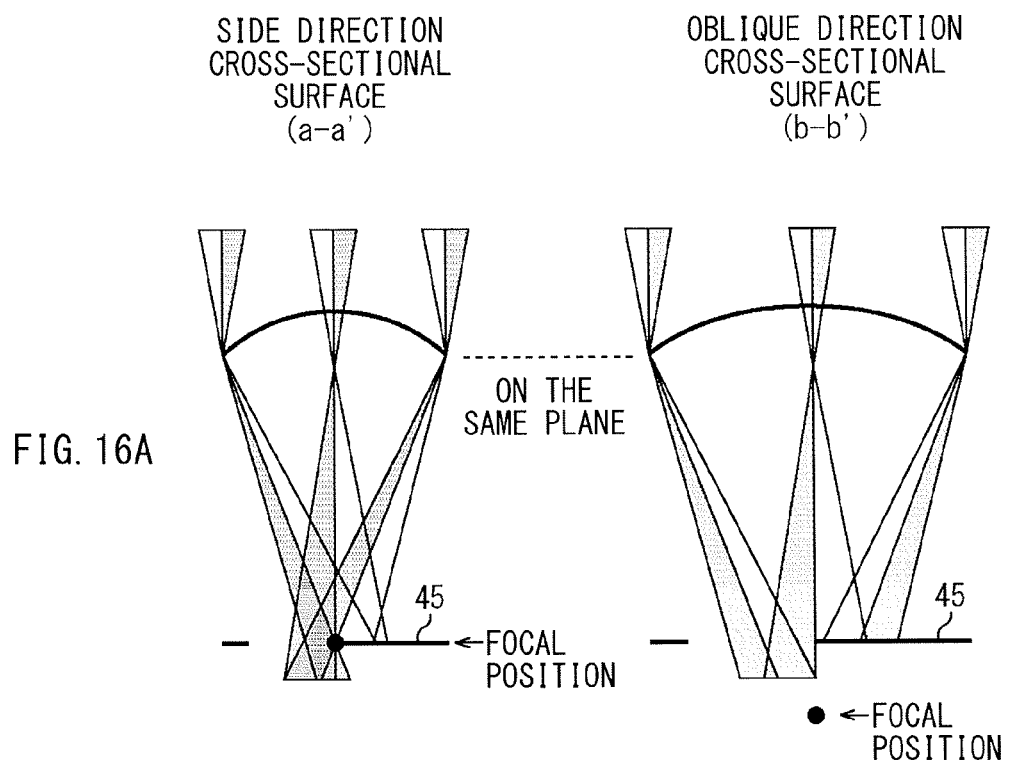
FIGS. 16A and 16B are each a schematic diagram for explaining a state of light collection that is performed by an AF pixel microlens according to a comparative example.
Figure 16B:
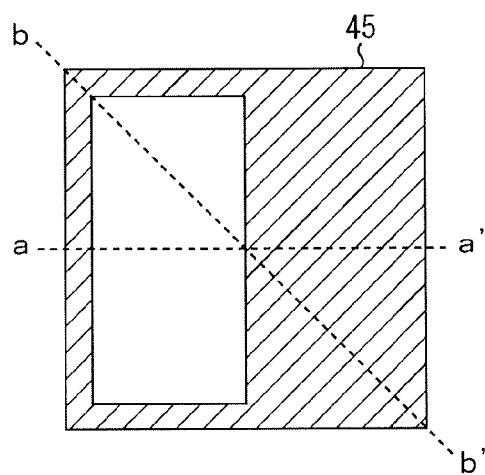

Each of FIGS. 16A and 16B shows a configuration according to a comparative example where a curvature radius of an AF pixel microlens is different in a side direction and in an oblique direction.

FIG. 16A shows a state of light collection by means of an AF pixel microlens according to a comparative example, and FIG. 16B shows a plan view of a light shielding section 45 for the AF pixels. Further, a cross-sectional surface (a-a' cross-sectional surface in FIG. 16B) in a side direction of the AF pixel microlens is shown on the left side of FIG. 16A, and a cross-sectional surface (b-b' cross-sectional surface in FIG. 16B) in an oblique direction of the AF pixel microlens is shown on the right side of FIG. 16A.

As shown in FIGS. 16A and 16B, in a configuration where a focal position in a side direction of the AF pixel microlens according to the comparative example coincides with the light shielding section 45, a focal position in an oblique direction of the AF pixel microlens is located away from the light shielding section 45. Consequently, a focal length is long in an oblique direction of the AF pixel microlens, which makes it difficult to separate light flux on the left and right sides in the comparative example.

Figure 17A:
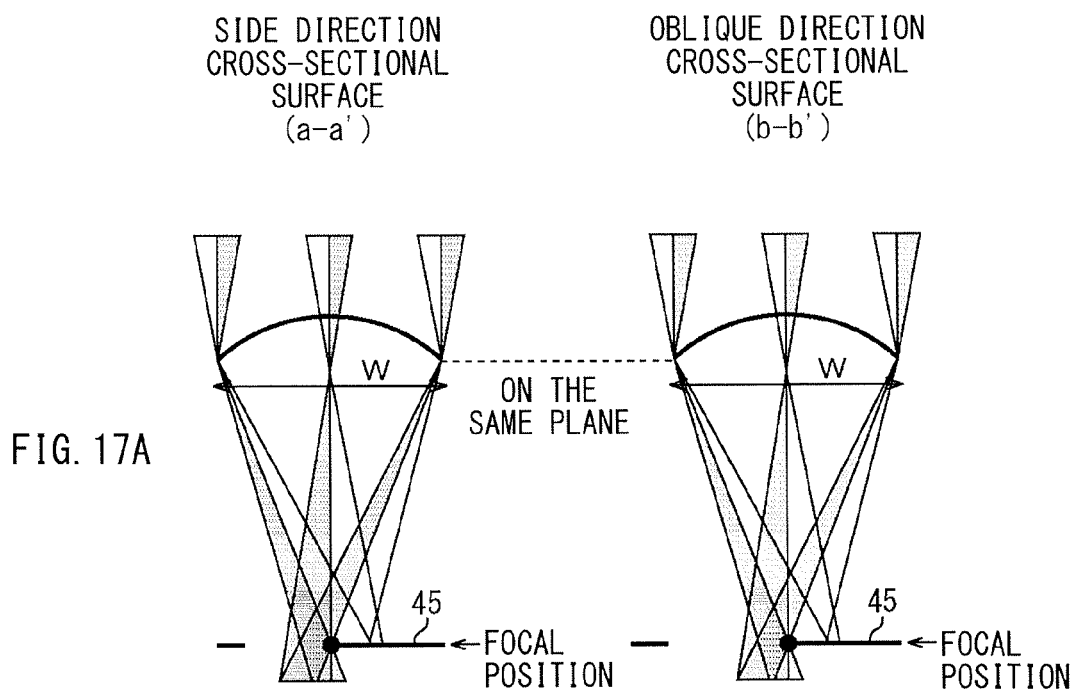
FIGS. 17A and 17B are each a schematic diagram for explaining a state of light collection that is performed by the microlens for the AF pixel according to one embodiment of the technology.
Figure 17B:
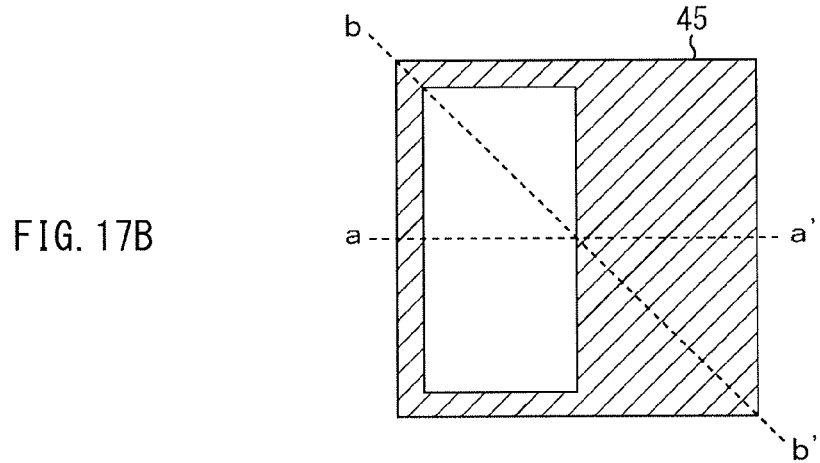

On the contrary, each of FIGS. 17A and 17B shows a configuration where a curvature radius becomes substantially the same in a side direction and in an oblique direction as with the AF pixel microlens 18 of the solid-state image pickup device 11A. As shown in FIGS. 17A and 17B, in the AF pixel microlens 18, a curvature radius is virtually the same in a side direction and in an oblique direction, and thus a focal position is not changed in a side direction and in an oblique direction. As a result, this makes it possible to improve the separation performance of the image plane phase difference AF.

Here, for example, a technology is disclosed in Japanese Unexamined Patent Application Publication No. 2009-109965 that improves a pupil division phase difference AF functionality by performing light shielding of some pixels and by setting a focal distance of an AF detection microlens to a focal point of a microlens in front of a subject. As a method of adjusting a focal point in the technology that is disclosed in Japanese Unexamined Patent Application Publication No. 2009-109965, the AF functionality is improved by adjusting a curvature radius of a microlens to a small value or adjusting a refractive index to a high value to separate light flux from left and right exit pupils. However, Japanese Unexamined Patent Application Publication No. 2009-109965 fails to disclose a specific manufacturing method, or a technology including the method of controlling the shape of each microlens. Further, a cross-sectional surface from one direction is only shown in drawings, and effects thereof are only described in the specification thereof. Hence, Japanese Unexamined Patent Application Publication No. 2009-109965 is silent with regard to the optimization of three-dimensional directions of microlenses. In other words, in the technology that is disclosed in Japanese Unexamined Patent Application Publication No. 2009-109965, obtaining the effect of improving the separation performance of the image plane phase difference AF in the solid-state image pickup device 11A as described above is not possible.

Figure 18:
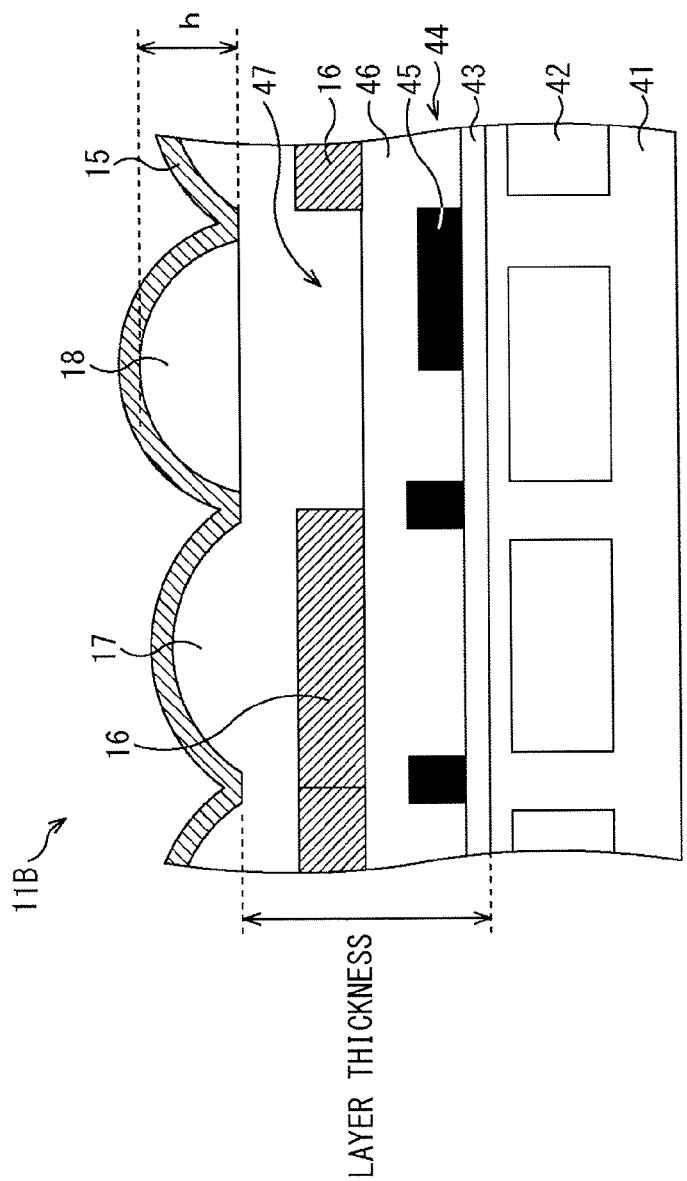
FIG. 18 is a cross-sectional view showing an example of a configuration where the microlens array is applied to a solid-state image pickup device of a backside-illumination type.
Figure 19A:
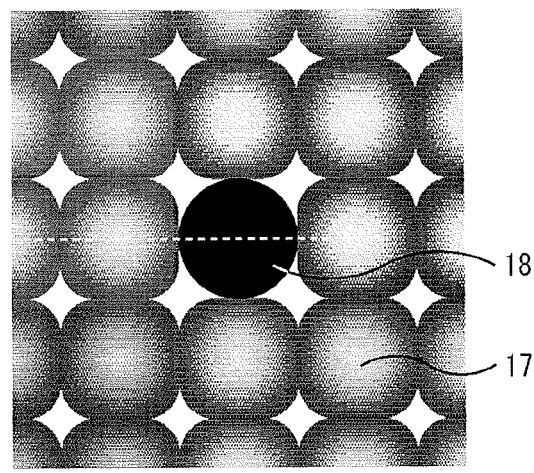
FIGS. 19A and 19B are each a schematic diagram showing the microlens array and an inter-pixel light shielding film.
Figure 19B:
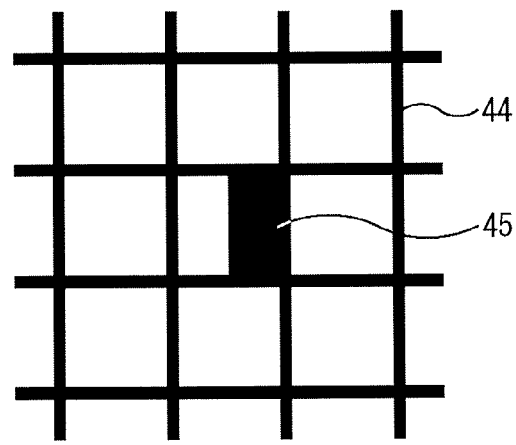

Next, with reference to FIG. 18 as well as FIGS. 19A and 19B, the description is provided on an example of a configuration where the microlens array 14A having the image pickup pixel microlenses 17 and the AF pixel microlenses 18 is applied to a solid-state image pickup device of a backside-illumination type.

FIG. 18 shows a cross-sectional surface of a solid-state image pickup device 11B of a backside-illumination type. Further, FIG. 19A shows a planar arrangement of the image pickup pixel microlenses 17 and the AF pixel microlenses 18, and FIG. 19B shows a planar shape of an inter-pixel light shielding film. It is to be noted that FIG. 18 shows a cross-sectional surface of the solid-state image pickup device 11B of a backside-illumination type in a dashed line denoted in FIG. 19A.

In the solid-state image pickup device 11B of a backside-illumination type, on a cross-sectional surface thereof, photodiodes 42 are formed within a silicon substrate 41, and an insulating film 43 is formed on the silicon substrate 41. The insulating film 43 may be configured in either a single layer or a multilayer. For example, the insulating film 43 may be formed of a two-layered film that stacks a silicon oxide film on the silicon substrate 41 and stacks a hafnium oxide film thereon. In such a case, each of the silicon oxide film and the hafnium oxide film may be preferably formed with a film thickness that is best suited for antireflection.

An inter-pixel light shielding film 44 is formed corresponding to each pixel on the insulating film 43. The inter-pixel light shielding film 44 may be preferably formed of a material excellent in the light shielding performance and workability, such as aluminum or tungsten. Further, the inter-pixel light shielding film 44 is formed in the shape that is light-shielded to separate each pixel corresponding to each of the photodiodes 42. Additionally, the light shielding section 45 for the AF pixels is formed in the shape that light-shields half of the pixel.

On the inter-pixel light shielding film 44, a planarizing film 46 is formed that may be made of, for example, acrylic resin.

On the planarizing film 46, color filters 16 (for example, red filters 16R, green filters 16G, and blue filters 16B as described above) are formed corresponding to respective pixels. Here, at a location corresponding to the autofocusing AF pixel utilizing an image plane phase difference, there is provided an opening 47 where the color filters 16 are not formed, and the opening 47 is filled with the microlens material 21. More specifically, on the opening 47, the filters for transmitting red, green, and blue light therethrough are not arranged, although the microlens material 21 is buried into the opening 47, which means that it is possible to assume that filters for transmitting white light therethrough are formed corresponding to the above-described AF pixels.

On the top of the color filter 16, the image pickup pixel microlens 17 is formed. In a state of being interposed between the image pickup pixel microlenses 17, the AF pixel microlens 18 is formed in a smaller curvature radius than a curvature radius of the image pickup pixel microlens 17.

The microlens cover layer 15 is stacked on the image pickup pixel microlens 17 and the AF pixel microlens 18.

The solid-state image pickup device 11B of a backside-illumination type is of a structure where a multilayer wiring layer is not arranged on the silicon substrate 41 unlike a solid-state image pickup device of a front side-illumination type, and thus it is possible to reduce a layer thickness from the silicon substrate 41 to the image pickup pixel microlens 17 and the AF pixel microlens 18. This makes it possible to improve the incidence characteristics of light incoming into the solid-state image pickup device 11B of a backside-illumination type. It is to be noted that a curvature radius of the AF pixel microlens 18 is desirably formed in a smaller size than a curvature radius of the image pickup pixel microlens 17, and a focal position of the AF pixel microlens 18 is desirably set ahead (a position closer to the AF pixel microlens 18).

In the solid-state image pickup device 11B of a backside-illumination type that is configured in such a manner, even when the layer thickness is reduced, it is possible to increase a degree of freedom in controlling the shape in formation of the microlens by forming the AF pixel microlens 18 separately from the image pickup pixel microlens 17. This makes it possible to optimize the characteristics for each of the image pickup pixel microlens 17 and the AF pixel microlens 18, and thereby to improve the incident light characteristics. Therefore, in the solid-state image pickup device 11B of a backside-illumination type, it is possible to improve the AF detection accuracy and obtain images of better image quality.

Further, the solid-state image pickup device 11 as described above is applicable to various electronic apparatuses, including an image pickup system such as a digital still camera and a digital video camera, a mobile phone with built-in image pickup function, or any other apparatuses with image pickup functions.

Figure 20:
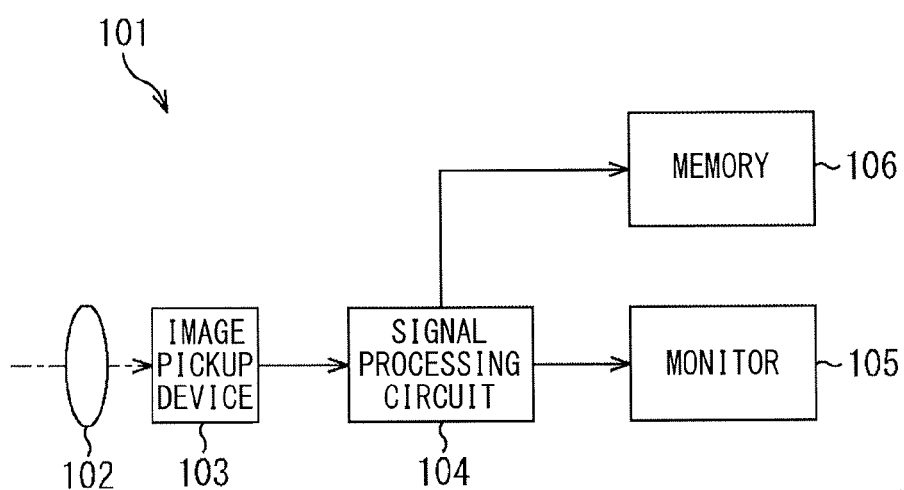
FIG. 20 is a schematic block diagram showing an example of a configuration of an image pickup unit that is mounted on an electronic apparatus.

FIG. 20 is a schematic block diagram showing an example of a configuration of an image pickup unit that is mounted on an electronic apparatus.

As shown in FIG. 20, an image pickup unit 101 includes an optical system 102, an image pickup device 103, a signal processing circuit 104, a monitor 105, and a memory 106, and is capable of take still images and moving images.

The optical system 102 has a single lens or a plurality of lenses, and guides image light (incident light) from a subject to the image pickup device 103 to form an image on a light-receiving plane (sensor section) of the image pickup device 103.

As the image pickup device 103, the solid-state image pickup device 11 according to any of the above-described embodiments of the present disclosure is applied. On the image pickup device 103, electrons are accumulated for a fixed period of time on the basis of an image formed on a light-receiving plane via the optical system 102. Subsequently, a signal corresponding to the electrons accumulated on the image pickup device 103 is provided to the signal processing circuit 104.

The signal processing circuit 104 performs various signal processing for a pixel signal that is output from the image pickup device 103. An image (image data) obtained by the signal processing performed by the signal processing circuit 104 is provided to the monitor 105 for display, or the memory 106 for storage (record).

In the image pickup unit 101 that is configured in such a manner, the solid-state image pickup device 11 according to any of the above-described embodiments of the present disclosure is applied as the image pickup device 103, thereby allowing to take images of better image quality by optimizing the microlenses in accordance with the pixel characteristics.

It is to be noted that the present disclosure is not limited to the above-described embodiments, and may be variously modified without departing from the gist of the present disclosure.

Furthermore, the technology encompasses any possible combination of some or all of the various embodiments described herein and incorporated herein.

It is possible to achieve at least the following configurations from the above-described example embodiments of the disclosure.

(1) A solid-state image pickup device, including:

a filter section including filters that are disposed corresponding to respective pixels, and each allowing light of a color that corresponds to corresponding one of the pixels to transmit therethrough, the pixels each being configured to receive the light of the predetermined color; and a microlens array section including a plurality of microlenses each configured to collect the light for corresponding one of the pixels, the microlenses being stacked with respect to the filter section, and being arranged in an array pattern corresponding to the respective pixels, wherein the microlenses have two or more shapes that are different from one another corresponding to the respective colors of the light to be received by the pixels, and each having an end that is in contact with the end of adjacent one of the microlenses.

(2) The solid-state image pickup device according to (1), wherein
the microlenses include a green pixel microlens provided corresponding to one of the pixels that receives green light, a red pixel microlens provided corresponding to one of the pixels that receives red light, and a blue pixel microlens provided corresponding to one of the pixels that receives blue light, and
the green pixel microlens has a curvature radius that is larger than a curvature radius of the red pixel microlens, and the blue pixel microlens has a curvature radius that is larger than the curvature radius of the green pixel microlens.

(3) The solid-state image pickup device according to (1) or (2), further including a microlens cover layer stacked on the microlenses that have the two or more shapes different from one another, and covering the microlenses.

(4) The solid-state image pickup device according to any one of (1) to (3), wherein
the microlenses include an image pickup pixel microlens and an autofocusing microlens, the image pickup pixel microlens being provided corresponding to an image pickup pixel that constructs an image, and the autofocusing microlens being provided corresponding to a pixel used for autofocusing that utilizes an image plane phase difference, and
the image pickup pixel microlens has a curvature radius that is larger than a curvature radius of the autofocusing microlens.

(5) An electronic apparatus provided with a solid-state image pickup device, the solid-state image pickup device including:
a filter section including filters that are disposed corresponding to respective pixels, and each allowing light of a color that corresponds to corresponding one of the pixels to transmit therethrough, the pixels each being configured to receive the light of the predetermined color; and
a microlens array section including a plurality of microlenses each configured to collect the light for corresponding one of the pixels, the microlenses being stacked with respect to the filter section, and being arranged in an array pattern corresponding to the respective pixels, wherein the microlenses have two or more shapes that are different from one another corresponding to the respective colors of the light to be received by the pixels, and each having an end that is in contact with the end of adjacent one of the microlenses.

(6) A method of manufacturing a solid-state image pickup device, the method including:
preparing the solid-state image pickup device, the solid-state image pickup device including
a filter section including filters that are disposed corresponding to respective pixels, and each allowing light of a color that corresponds to corresponding one of the pixels to transmit therethrough, the pixels each being configured to receive the light of the predetermined color, and
a microlens array section including a plurality of microlenses each configured to collect the light for corresponding one of the pixels, the microlenses being stacked with respect to the filter section, and being arranged in an array pattern corresponding to the respective pixels; and
forming the microlenses to have two or more shapes that are different from one another corresponding to the respective colors of the light to be received by the pixels, and each to have an end that is in contact with the end of adjacent one of the microlenses.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device, comprising:
a first plurality of photodiodes;
a second plurality of photodiodes;
a third plurality of photodiodes;
a first plurality of filters disposed above respective photodiodes of the first plurality of photodiodes;
a second plurality of filters disposed above respective photodiodes of the second plurality of photodiodes;
a third plurality of filters disposed above respective photodiodes of the third plurality of photodiodes;
a first plurality of microlenses disposed on respective filters of the first plurality of filters;
a second plurality of microlenses disposed on microlens material of the first plurality of microlenses between adjacent microlenses of the first plurality of microlenses; and
a third plurality of microlenses disposed on microlens material of the first plurality of microlenses between adjacent microlenses of the first plurality of microlenses,
wherein,
first and second end portions of each microlens of the second plurality of microlenses are disposed on the adjacent microlenses of the first plurality of microlenses,
center portions of each microlens of the second plurality of microlenses are disposed on microlens material of the adjacent microlenses of the first plurality of microlenses, and
first and second end portions of each microlens of the third plurality of microlenses are disposed to contact end portions of the adjacent microlenses of the first plurality of microlenses.

2. The imaging device according to claim 1, wherein a shape of the first plurality of microlenses is different from a shape of the second plurality of microlenses.

3. The imaging device according to claim 2, wherein the shape of the first plurality of microlenses is different from the shape of the second plurality of microlenses in a cross-section view.

4. The imaging device according to claim 2, wherein the shape of the first plurality of microlenses is different from the shape of the second plurality of microlenses in a plan view.

5. The imaging device according to claim 1, further including a microlens cover disposed on the first and second pluralities of microlenses.

6. An electronic apparatus comprising:
an imaging device including:
a first plurality of photodiodes;
a second plurality of photodiodes;
a third plurality of photodiodes;

a first plurality of filters disposed above respective photodiodes of the first plurality of photodiodes;
a second plurality of filters disposed above respective photodiodes of the second plurality of photodiodes;
a third plurality of filters disposed above respective photodiodes of the third plurality of photodiode;
a first plurality of microlenses disposed on respective filters of the first plurality of filters;
a second plurality of microlenses disposed on microlens material of the first plurality of microlenses between adjacent microlenses of the first plurality of microlenses; and
a third plurality of microlenses disposed on microlens material of the first plurality of microlenses between adjacent microlenses of the first plurality of microlenses,
wherein first and second end portions of each microlens of the second plurality of microlenses are disposed on the adjacent microlenses of the first plurality of microlenses, center portions of each microlens of the second plurality of microlenses are disposed on microlens material of the adjacent microlenses of the first plurality of microlenses, and first and second end portions of each microlens of the third plurality of microlenses are disposed to contact end portions of the adjacent microlenses of the first plurality of microlenses; and
an optical system including at least one lens configured to guide light to a light-receiving plane of the imaging device.

7. The electronic apparatus according to claim 6, wherein a shape of the first plurality of microlenses is different from a shape of the second plurality of microlenses.

8. The electronic apparatus according to claim 7, wherein the shape of the first plurality of microlenses is different from the shape of the second plurality of microlenses in a cross-section view.

9. The electronic apparatus according to claim 7, wherein the shape of the first plurality of microlenses is different from the shape of the second plurality of microlenses in a plan view.

10. The electronic apparatus according to claim 6, further including a microlens cover disposed on the first and second pluralities of microlenses.

* * * * *